United States Patent
Chittipeddi et al.

(10) Patent No.: US 6,538,283 B1
(45) Date of Patent: Mar. 25, 2003

(54) SILICON-ON-INSULATOR (SOI) SEMICONDUCTOR STRUCTURE WITH ADDITIONAL TRENCH INCLUDING A CONDUCTIVE LAYER

(75) Inventors: Sailesh Chittipeddi, Allentown, PA (US); Michael J. Kelly, Orefield, PA (US)

(73) Assignee: Lucent Technologies Inc., Murray Hill, NJ (US)

( * ) Notice: Subject to any disclaimer, the term of this patent is extended or adjusted under 35 U.S.C. 154(b) by 15 days.

(21) Appl. No.: 09/611,907

(22) Filed: Jul. 7, 2000

(51) Int. Cl.⁷ ............................................. H01L 27/01
(52) U.S. Cl. ..................... 257/347; 257/349; 257/532
(58) Field of Search .................. 257/311, 301, 257/304, 305, 347, 349, 350, 532; 438/311, 386, 243, 245, 248, 388, 391

(56) References Cited

U.S. PATENT DOCUMENTS

| | | |
|---|---|---|
| 4,534,076 A | 8/1985 | Barge |
| 4,908,844 A | 3/1990 | Hasegawa |
| 5,155,758 A | 10/1992 | Vogel |
| 5,305,365 A | 4/1994 | Coe |
| 5,349,956 A | 9/1994 | Bonutti |
| 5,386,447 A | 1/1995 | Siczek |
| 5,475,885 A | 12/1995 | Ishikawa |
| 5,585,285 A | 12/1996 | Tang |
| 5,640,958 A | 6/1997 | Bonutti |
| 5,743,264 A | 4/1998 | Bonutti |
| 5,770,875 A * | 6/1998 | Assaderaghi et al. ........ 257/301 |
| 5,976,945 A | 11/1999 | Chi et al. |
| 5,982,005 A | 11/1999 | Hidaka et al. |
| 6,246,239 B1 | 6/2001 | Krogmann et al. |

FOREIGN PATENT DOCUMENTS

| | | |
|---|---|---|
| EP | 0 848 418 A2 | 6/1998 |
| WO | WO 97/17896 | 5/1997 |

OTHER PUBLICATIONS

European Search Report dated Oct. 23, 2001 for European Patent Application EP 01 11 4983.

* cited by examiner

Primary Examiner—Olik Chaudhuri
Assistant Examiner—Yennhu B. Huynh

(57) ABSTRACT

A semiconductor device comprising a silicon-on-insulator (SOI) substrate including a base substrate, an insulator layer, and a silicon layer, and a trench capacitor including at least one trench formed in the silicon-on-insulator substrate and extending through the base substrate, the insulator layer and the silicon layer, wherein the at least one trench includes at least one layer of silicon dioxide formed therein. In a preferred embodiment, semiconductor material disposed in the at least one trench forms a first electrode of a semiconductor capacitor, and semiconductor material of the SOI substrate which lies adjacent to the at least one trench forms a second electrode of the capacitor.

17 Claims, 11 Drawing Sheets

SILICON-ON-INSULATOR (SOI) SEMICONDUCTOR STRUCTURE WITH ADDITIONAL TRENCH INCLUDING A CONDUCTIVE LAYER

RELATED APPLICATIONS

The present invention is related to commonly-assigned U.S. patent application Ser. No. 09/557,536, now U.S. Pat. No. 6,387,772.

FIELD OF THE INVENTION

The present invention relates to semiconductor devices and methods for forming the same, and in particular, to capacitors and methods of forming the same.

DESCRIPTION OF THE RELATED ART

Semiconductor devices typically utilize capacitors to perform various functions, such as electric charge storage, for example. A standard capacitor includes two electrodes or "plates" separated from each other by a dielectric insulating material. The electrodes are typically formed of electrically conductive or semiconductive materials. The ability of a capacitor to store an electric charge depends on the capacitor area. Since many capacitors are formed above the surface of a semiconductor substrate, as the area of the capacitor increases (to increase the charge-holding capacity), the space left available on the semiconductor substrate for other devices is decreased. As a result, in order to minimize the surface area occupied by capacitors, trench capacitors have become highly favored in the semiconductor manufacturing industry.

Trench capacitors extend down from the surface of the semiconductor substrate. Thus, instead of being formed on the surface of the semiconductor substrate, the capacitor is formed in a trench which is dug in the semiconductor substrate. Accordingly, the capacitor area (and implicitly the charge-holding capacity of the capacitor) may be increased by increasing the depth and width of the trench. As will be understood, the formation of the capacitor beneath the surface of the semiconductor substrate frees up space on the surface of the semiconductor substrate for additional devices.

A recent trend in the semiconductor industry has been towards the use of silicon-on-insulator (SOI) semiconductor substrates. A standard SOI substrate includes a doped base substrate layer (typically formed of silicon), an insulator layer, and an upper doped silicon layer. SOI substrates are favored because active devices formed within an upper silicon layer are insulated from the base substrate. Therefore, device leakage through the substrate is minimized, and problems associated electrical coupling to the substrate are reduced or eliminated. The use of SOI substrates, however, presents a problem since trench openings formed in the substrate (used to form, for example, trench capacitors) must extend through the insulating layer in order for the trench capacitor to have sufficient area, thereby exposing the upper silicon layer to the base substrate layer. The problem results because the silicon base substrate layer can become electrically shorted to the upper silicon layer.

Therefore, there is currently a need for a trench capacitor which is at least partially formed in the silicon base substrate layer of an SOI substrate, and which provides electrical isolation between the silicon base substrate layer and the upper silicon layers of the SOI substrate.

SUMMARY OF THE INVENTION

The present invention is a semiconductor device including a silicon-on-insulator substrate including a base substrate, an insulator layer, and a silicon layer, and a trench capacitor including at least one trench formed in the silicon-on-insulator substrate and extending through the base substrate, the insulator layer and the silicon layer, wherein the at least one trench includes at least one insulator layer formed therein.

The above and other advantages and features of the present invention will be better understood from the following detailed description of the preferred embodiments of the invention which is provided in connection with the accompanying drawings.

BRIEF DESCRIPTION OF THE DRAWINGS

FIG. 1 is a side cross-sectional view showing a silicon-on-insulator (SOI) substrate.

FIG. 2 is a side cross-sectional view showing a silicon-on-insulator substrate with a second insulator layer and an oxide resistant film formed on the SOI substrate.

FIG. 3 is a side cross-sectional view showing a silicon-on-insulator substrate showing the formation of a pair of trenches, which are filled with a conductive layer.

FIG. 4 is a side cross-sectional view showing the formation of a second oxide resistant film layer.

FIG. 5 is a side cross-sectional view showing the formation of a masking layer.

FIG. 6 is a side cross-sectional view showing the etching away of the second oxide resistant layer in one of the trenches.

FIG. 7 is a side cross-sectional view showing the formation of a third insulator layer in one of the trenches.

FIG. 8 is a side cross-sectional view showing the masking and etching away of portions of the second oxide resistant layer.

FIG. 9 is a side cross-sectional view showing the formation of a second conductive layer.

FIG. 10 is a side cross-sectional view showing a the formation of a dielectric layer.

FIG. 11 is a side cross-sectional view showing a the formation of conductive contacts.

DETAILED DESCRIPTION

Referring to FIGS. 1–11, there is shown a process for forming a semiconductor capacitor device 100 according to an exemplary embodiment of the present invention.

Figure 1:
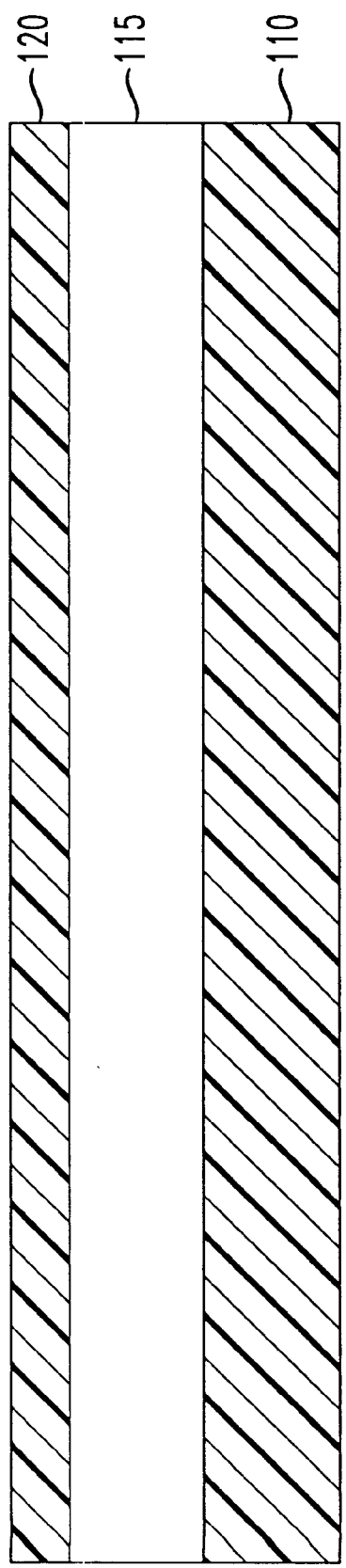
FIGS. 1–11 show a process sequence used to form a capacitor and contact structure according to an exemplary embodiment of the present invention.

FIG. 1 shows a silicon-on-insulator (SOI) substrate formed of a semiconductor base substrate layer 110, an insulator layer 115, and a silicon layer 120. The semiconductor base substrate layer 110 may be formed of a silicon (Si) wafer, as is well known in the semiconductor manufacturing industry, however, other materials may also be used for the semiconductor base substrate layer without departing from the scope of the invention. Insulator layer 115 may be formed of silicon dioxide ($SiO_2$), however, other insulators may also be utilized. Silicon layer 120 may be a crystal silicon layer, an amorphous silicon layer, or may be a polycrystalline silicon layer (commonly referred to as polysilicon). A thickness of the insulator layer 115 may be in a range 200 angstroms to 6000 angstroms, and a thickness of the silicon layer 120 may be in a range 500 angstroms to 4000 angstroms. However, it should be noted that the above ranges are only suggested dimensions, and that the thicknesses of the insulator layer 115 and silicon layer 120 may be in any suitable range.

Figure 2:
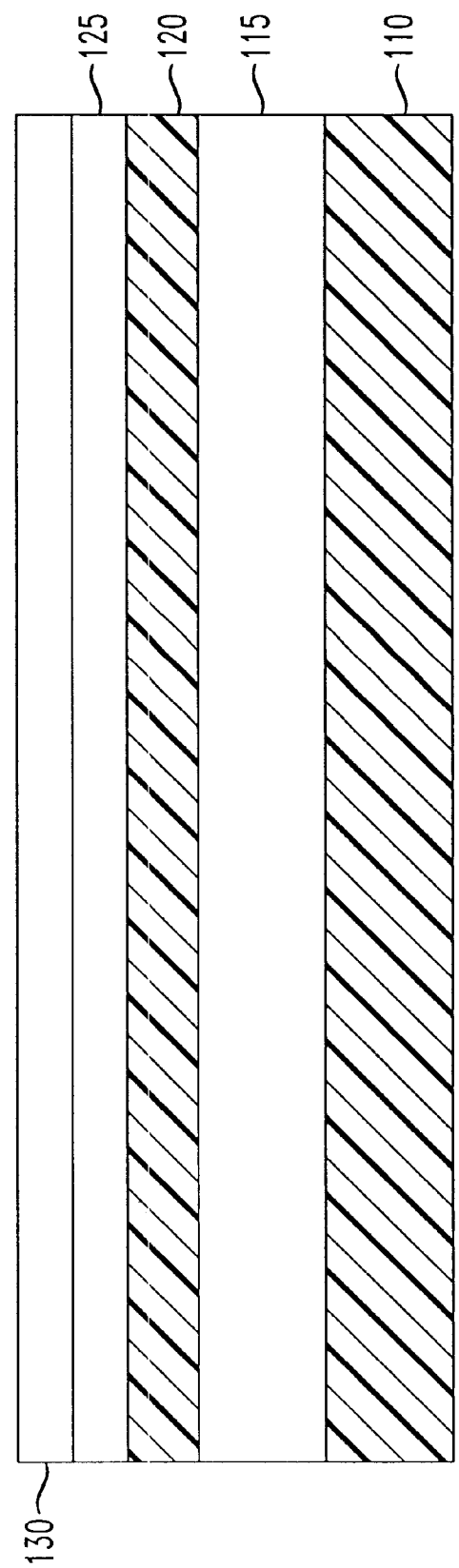

FIG. 2 shows a second step in the process wherein a second insulator layer 125 and an oxide resistant film layer 130 are successively laid down on the silicon layer 120.

As above, the second insulator layer may be $SiO_2$ or any other suitable insulator. The oxide resistant film layer 130 may be formed of silicon nitride ($Si_3N_4$), titanium nitride (TiN), tungsten nitride (WN), tantalum nitride (TaN), or any other suitable oxide resistant material. A thickness of the second insulator layer 125 may be in a range from 100 angstroms to 500 angstroms. A thickness of the oxide resistant film layer 130 may be in a range from 50 angstroms to 5000 angstroms, and preferably in a range from 300 to 600 angstroms. The second insulator layer 125 and the oxide resistant film layer 130 are laid down on the silicon layer 120 by processes well known in the semiconductor manufacturing industry.

Figure 3:
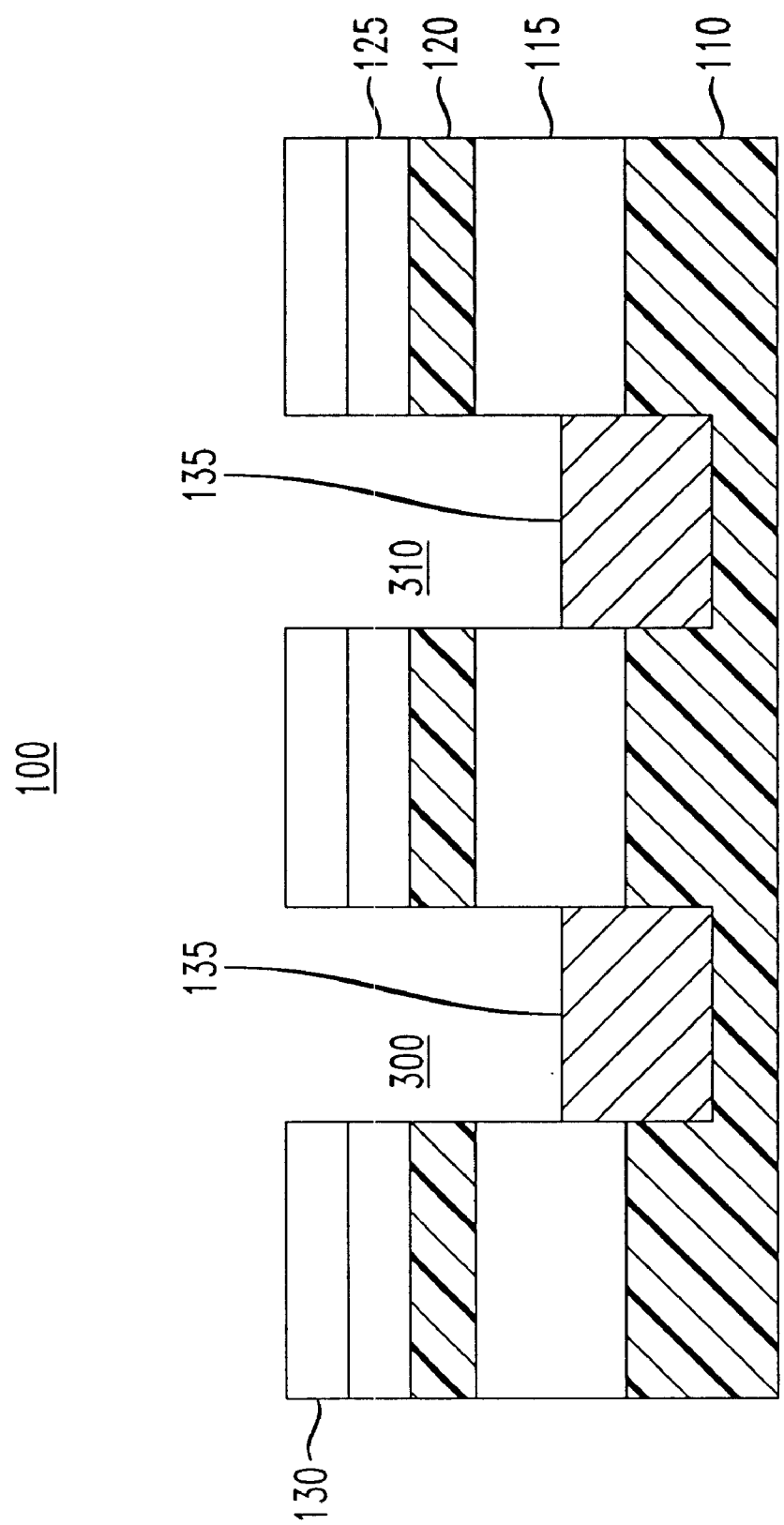

FIG. 3 shows a third step in the process wherein trenches 300, 310 are formed and filled with a conductive material 135, such as silicon (preferably doped polysilicon). The trenches 300, 310 may be formed by etching and other well-known processes. The trenches 300, 310 are used to form separate terminals of a trench capacitor, as explained below. As shown in FIG. 3, the trenches 300, 310 preferably extend at least partially into the base substrate layer 110. The width of the trench 300 preferably varies from 0.1 microns to 2–3 microns, and the depth of the trench preferably varies from 0.5 microns to 6 microns. An "aspect ratio" of the trench 300 is defined as the ratio of the depth to the width, and is preferably less than or equal to 6. Trench 310, may have the same or similar dimensions to that of trench 300, but such a geometry is not required. For simplicity, trenches 300 and 310 are shown as having the same dimensions in the figures. It will be noted that trench 300 forms a trench capacitor and trench 310 forms a contact structure for contacting the base substrate layer 110 of the SOI substrate. The conductive layer 135 may be formed by growing epitaxial silicon on the base substrate layer 120, or by deposition processes well known in the art (e.g., Chemical Vapor Deposition (CVD)).

Figure 4:
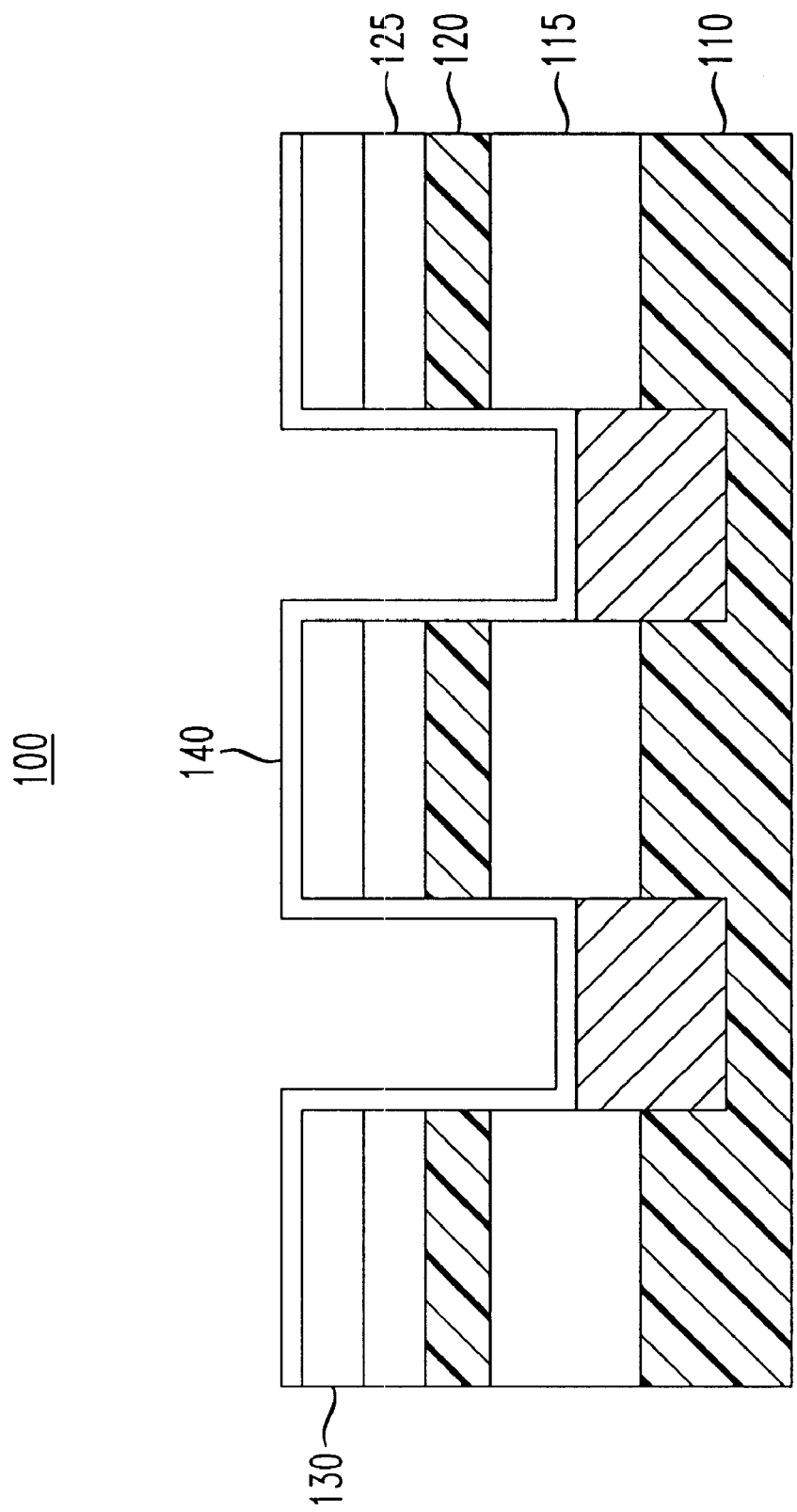

FIG. 4 shows a fourth step in the process wherein a second oxide resistant layer 140 is formed on the upper surface of the device 100. As with the first oxide resistant layer 130, the second oxide resistant layer 140 may be formed of $Si_3N_4$, TiN, WN, TaN, or any other suitable oxide resistant material. The oxide resistant layer 140 preferably has a thickness in a range from 50 angstroms to 500 angstroms. The second oxide resistant film layer 140 substantially prevents electrical shorting which may occur between the base substrate layer 110 and the upper silicon layer 120.

Figure 5:
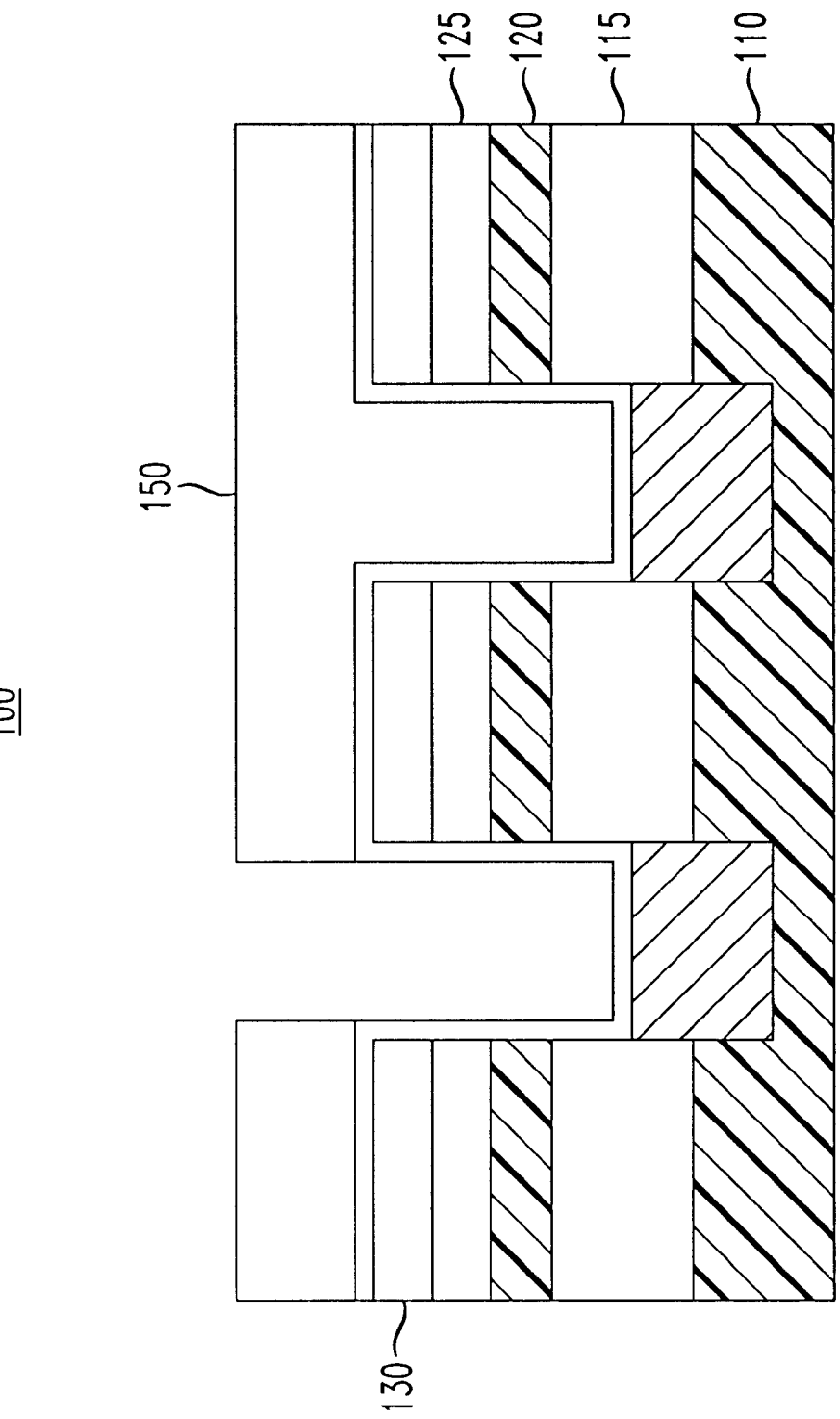

FIG. 5 shows a fifth step in the process wherein a masking film 150 is deposited on specified portions of the upper surface of the device 100. The masking film 150 is preferably formed of a photoresist material, however, other suitable masking films may also be used. In the exemplary embodiment, the masking film 150 covers all portions of the upper surface of the device 100 except trench 300.

Figure 6:
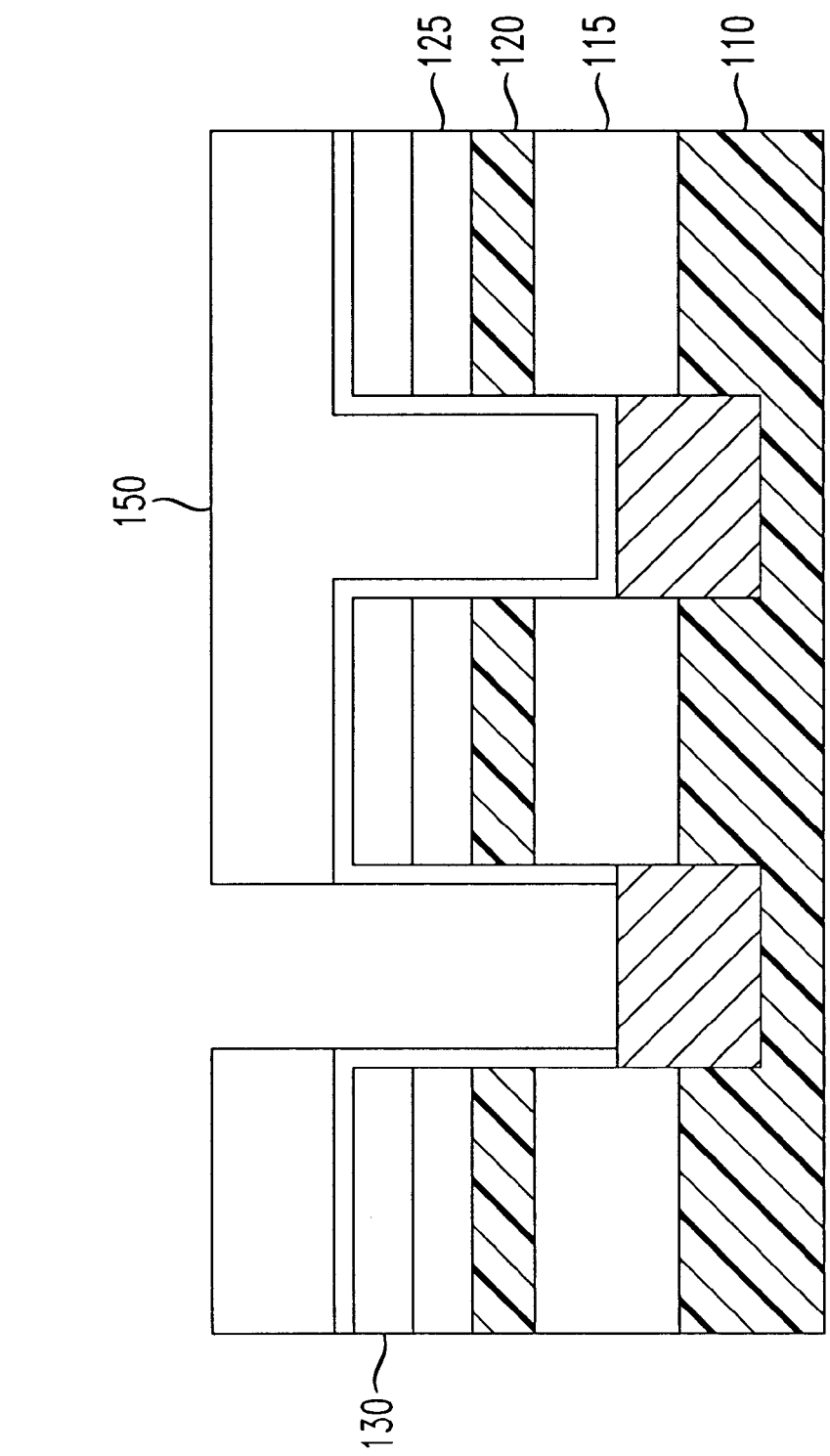

As shown in FIG. 6, after the masking layer 150 is deposited, it is exposed and the portion of the second oxide resistant layer 140 deposited in the trench 300 is etched away to expose the conductive layer 135 at the bottom of the trench.

Figure 7:
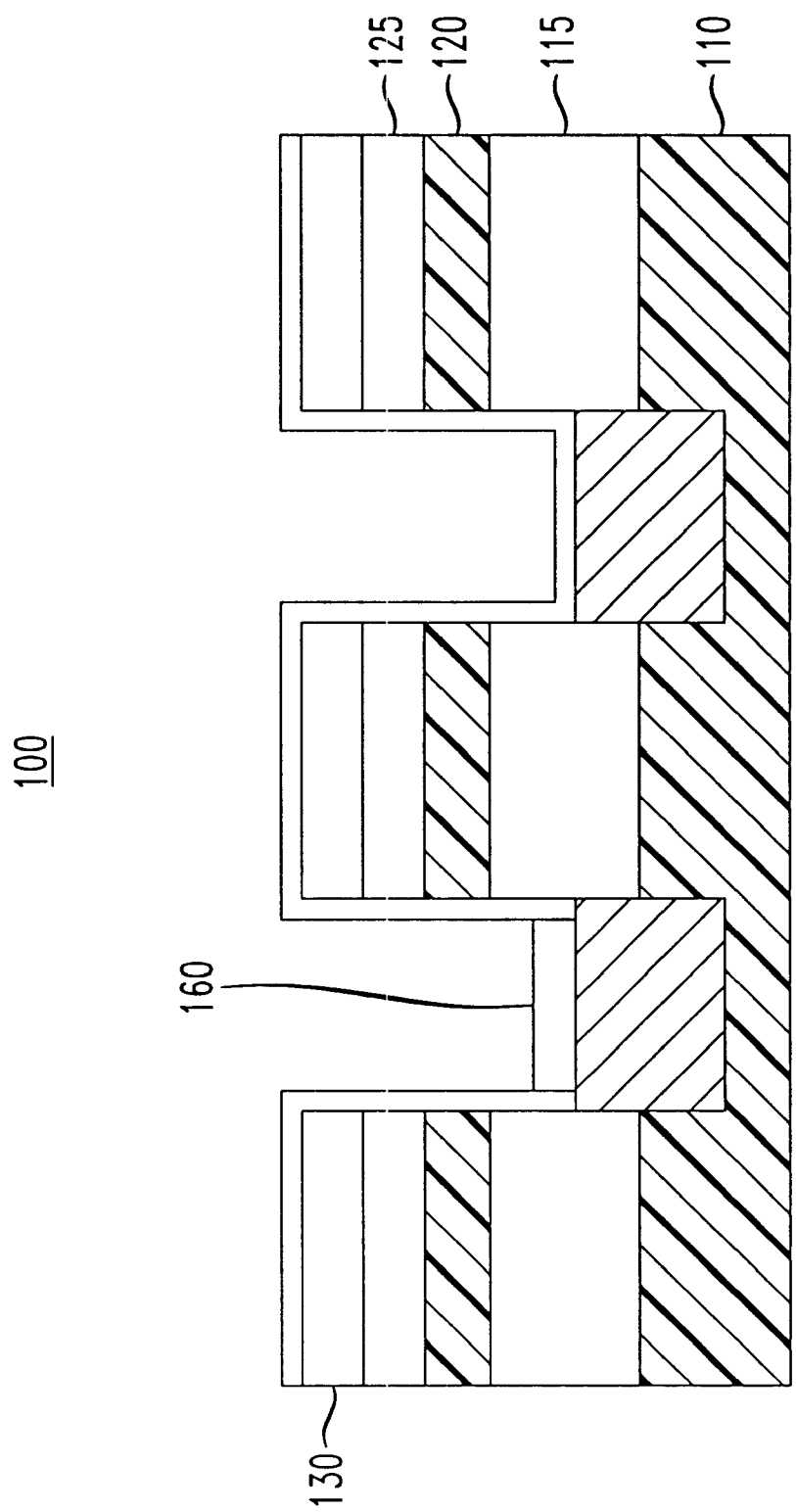

FIG. 7 shows a sixth step in the process wherein a third insulator layer 160 is laid down in the trench 300 on the conductive layer 135. The third insulator layer is preferably formed of silicon dioxide, but may be formed of other suitable insulators. The third insulator layer may be formed by growing silicon dioxide on the conductive layer 135 (if the conductive layer is formed of silicon), or by deposition (which would require an additional masking step, as is well known in the art). The third insulator layer 160 preferably has an area in a range from 1 square micron to 500 square microns.

Figure 8:
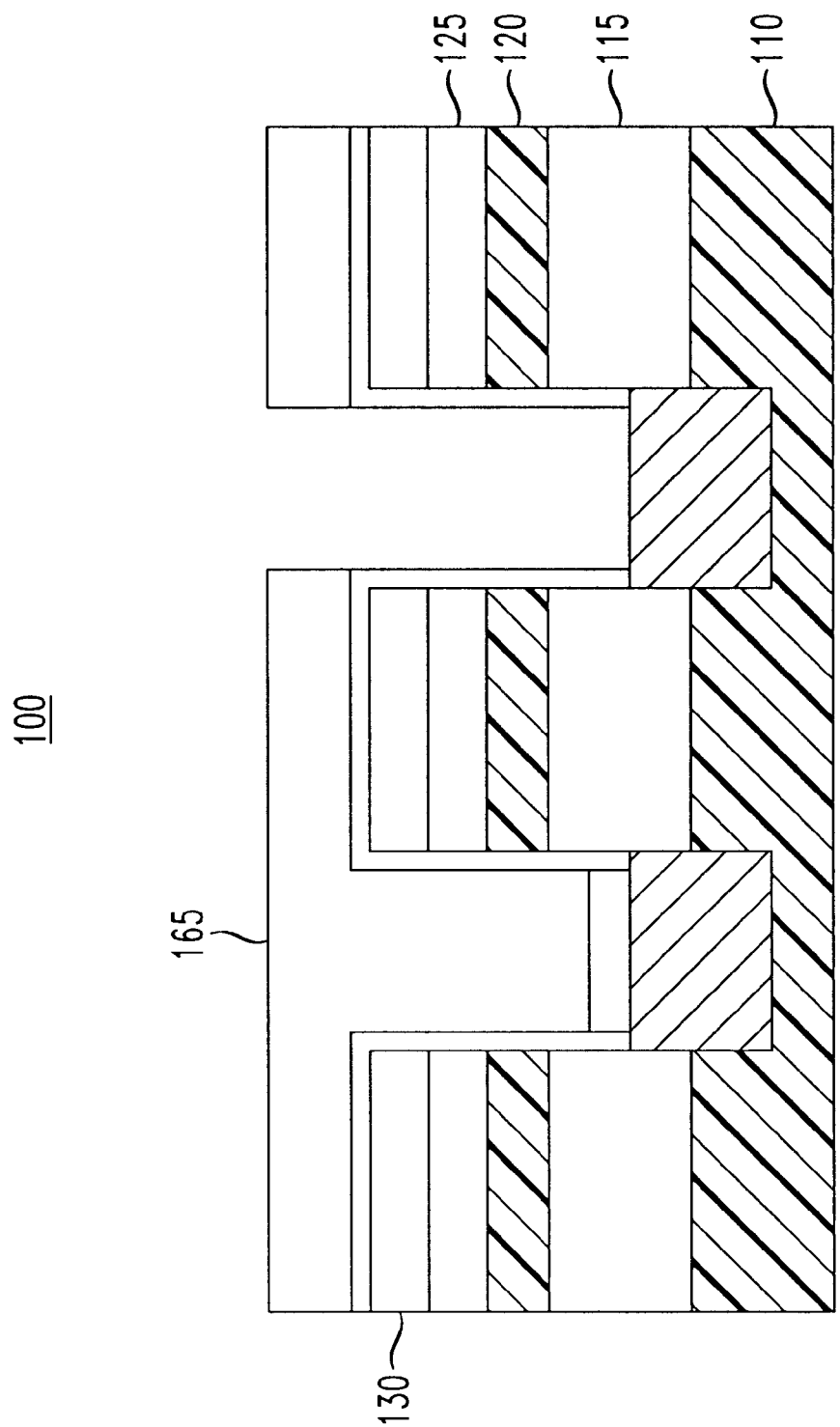

FIG. 8 shows a seventh step in the process wherein portions of the second oxide resistant film layer 140 are removed. A second masking layer 165, and an anisotropic etch process are used to remove the second oxide resistant film layer 140 from the bottom of the trench 310, and from the upper surface of the device 100, respectively.

Figure 9:
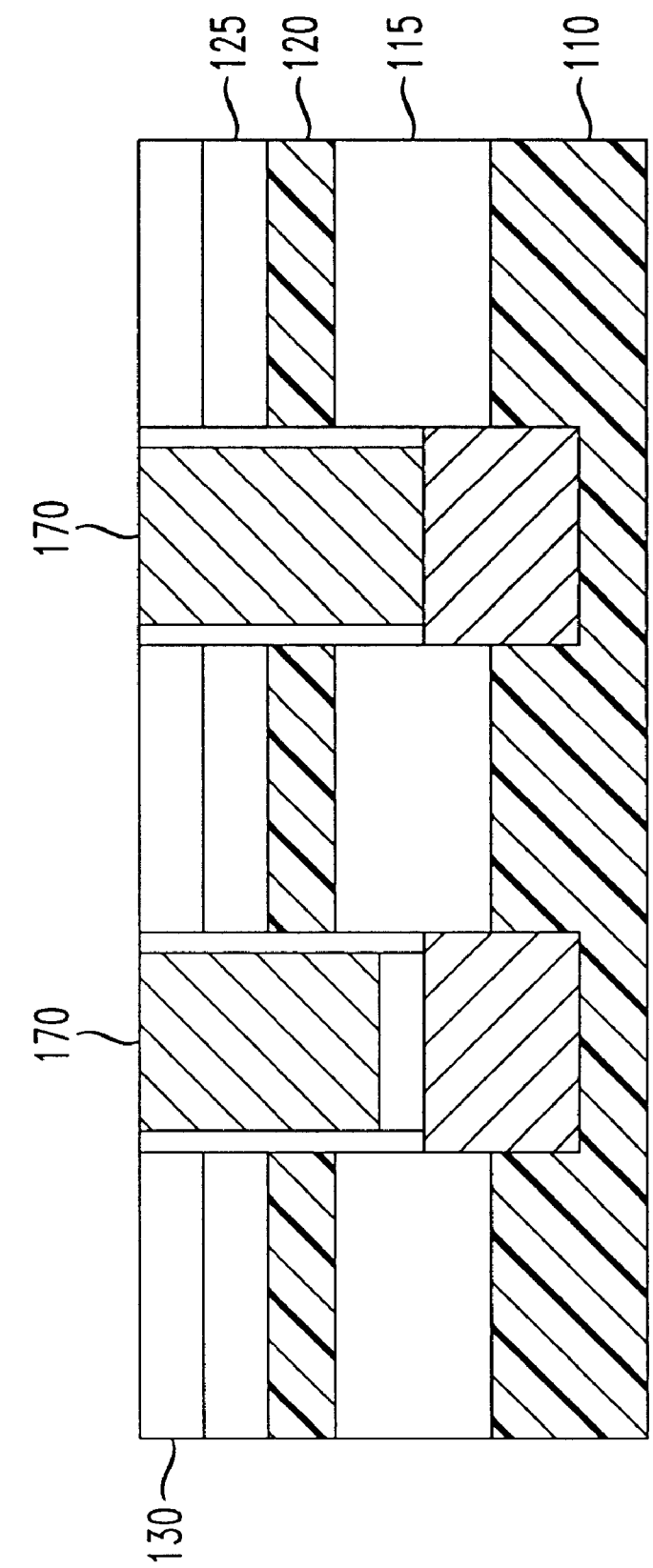

FIG. 9 shows an eighth step in the process wherein a second conductive layer 170 is used to fill both of the trenches 300, 310. The second conductive layer 170 may be formed of silicon, and is preferably formed of polysilicon. First, the second conductive layer 170 is deposited in the trenches 300, 310, and then the upper surface of the device 100 is planarized (using well known techniques such as Chemical Mechanical Polishing (CMP)) to form the device as shown in FIG. 9.

Figure 10:
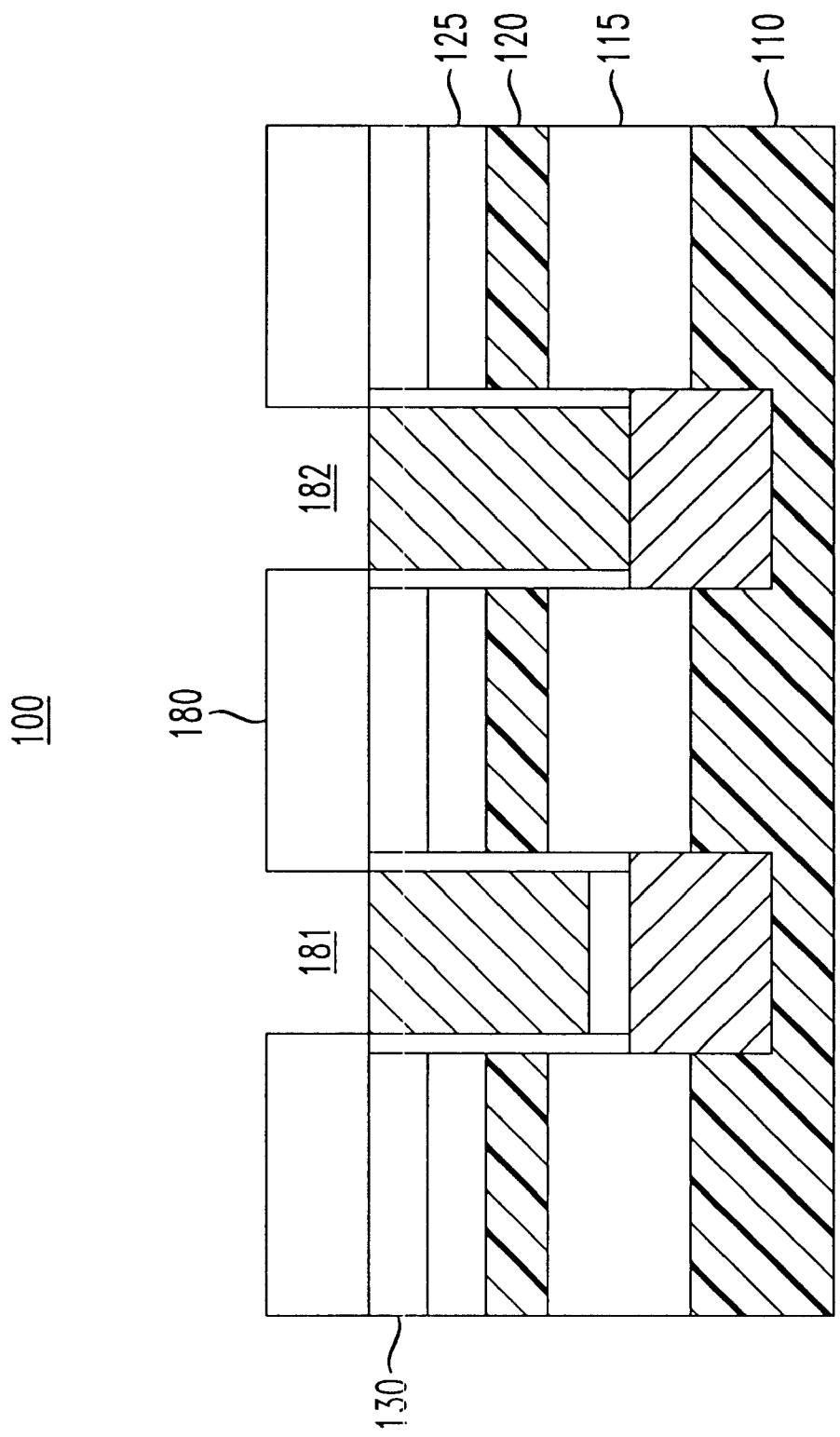

FIG. 10 shows a ninth step in the process wherein a dielectric layer 180 is deposited on the device and portions overlying the trenches 300, 310 are etched away. The dielectric layer 180 may be formed of materials such as silicon nitride ($Si_3N_4$), silicon dioxide ($SiO_2$), and silicon oxynitride (SiON), or any other suitable dielectric material. The dielectric layer 180 may be deposited by processes well known in the art, such as chemical vapor deposition (CVD). After the dielectric layer 180 is formed on the entire surface of the device 100, vias 181, 182 are etched in the dielectric material to expose the trenches 300, 310. The vias 181, 182 may be formed by conventional patterning and etching techniques which are well known in the art.

Figure 11:
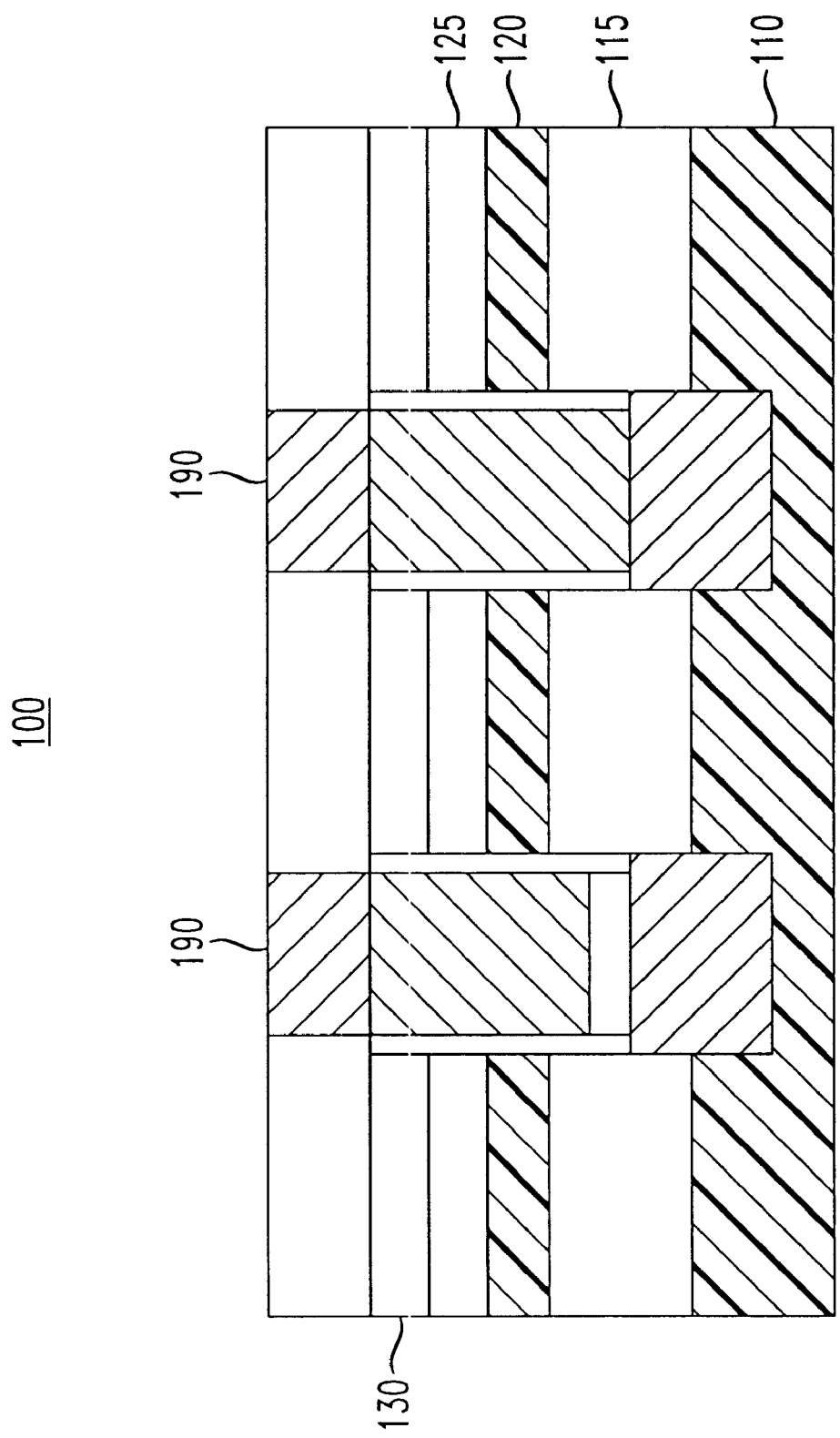

FIG. 11 shows an tenth (and final) step in the process wherein conductive contacts 190 are formed on the upper surface of the device 100. Conductive contacts 190 are signal contact landings which allow the coupling of electrical signals to the capacitor device 100. The conductive contacts may be formed of any suitable conductor, however, metals are preferred. The upper surface of the device 100 may be planarized (by CMP or otherwise) at this point, so that the conductive contacts 190 are flush with the dielectric layer 180, and so that additional levels may be formed on the upper surface of the device.

Thus, the above-described process may be utilized to form a capacitor device 100 as shown in FIG. 11. The conductive layers 135 and 170 formed in trench 300 form a first electrode of the capacitor, and the portions of the base substrate layer 110 which are adjacent to the trench 300 form a second electrode of the capacitor. Contact to the first electrode may be made via metal land 300 which overlies trench 300, and contact to the second electrode may be made via metal land 300 which overlies trench 310.

It is to be emphasized, that an aspect of the present invention is a trench capacitor formed on a SOI substrate and having an electrode (second) formed by regions of the base substrate layer 110 which are adjacent to the trench and which are disposed beneath the insulating layer 115 of the SOI substrate. A further aspect of the present invention is the contact structure (trench 310) formed in close proximity to the trench capacitor, and which extends through the insulating layer 115 of the SOI substrate. Accordingly, the conductive layers 135 and 170 formed in the trench 300 form a first electrode of the semiconductor capacitor, and the portions of the base substrate layer 110 which bound the trench 300 form a second electrode of the semiconductor capacitor which may be contacted via the contact structure formed in trench 310.

Yet another advantage of the present invention is that the uppermost surface (i.e., the surface with conductive contacts 190) of the device 100 is planar, thereby allowing the formation of additional levels on the upper surface of the device without the need for intervening layering steps.

Although the invention has been described in terms of exemplary embodiments, it is not limited thereto. Rather, the appended claims should be construed broadly, to include other variants and embodiments of the invention which may be made by those skilled in the art without departing from the scope and range of equivalents of the invention.

What is claimed is:

1. A semiconductor device comprising:
    a silicon-on-insulator substrate including a base substrate layer, an insulator layer, and a silicon layer; and
    a trench capacitor including at least one trench formed in the silicon-on-insulator substrate and extending through the silicon layer and the insulator layer to the base substrate layer, wherein the at least one trench includes at least one insulator layer formed therein,
    wherein the trench capacitor includes at least one additional trench which extends through the silicon layer and the insulator layer to the base substrate layer, and wherein the at least one additional trench includes a conductive layer disposed therein.

2. The semiconductor device of claim 1, wherein the at least one insulator layer comprises silicon dioxide.

3. The semiconductor device of claim 1, wherein the at least one trench includes at least one first conductive layer disposed on a first side of the insulator layer and at least one second conductive layer disposed on a second opposing side of the insulator layer.

4. The semiconductor device of claim 3, wherein the at least one first conductive layer comprises a layer of silicon.

5. The semiconductor device of claim 3, wherein the at least one first and second conductive layers comprise layers of silicon.

6. The semiconductor device of claim 3, wherein the at least one first conductive layer forms a portion of a first electrode of the trench capacitor.

7. The semiconductor device of claim 3, wherein the at least one first and second conductive layers form a first electrode of the trench capacitor.

8. The semiconductor device of claim 6, wherein portions of said base substrate which are adjacent to said at least one trench form a second electrode of said trench capacitor.

9. The semiconductor device of claim 8, wherein portions of said base substrate which are adjacent to said at least one trench form a second electrode of said trench capacitor.

10. The semiconductor device of claim 1, wherein the conductive layer comprises silicon.

11. The semiconductor device of claim 1, wherein the at least one additional trench forms a contact structure for contacting the base substrate layer of the silicon-on-insulator substrate.

12. The semiconductor device of claim 1, further comprising:
    a second insulator layer disposed on the silicon layer of the silicon-on-insulator substrate; and,
    a first oxide resistant film layer disposed on the second insulator layer.

13. The semiconductor device of claim 12, further comprising:
    a dielectric layer formed over the silicon layer of the silicon-on-insulator substrate, said dielectric layer including a first opening therein for providing contact to the at least one trench, and including a second opening therein for providing contact to the at least one additional trench.

14. The semiconductor device of claim 13, further comprising:
    a first conductive contact formed in the first opening; and
    a second conductive contact formed in the second opening,
    wherein said first and second conductive contacts provide electrical connection terminals.

15. The semiconductor device of claim 1, further comprising:
    a dielectric layer formed over the first oxide resistant film layer, said dielectric layer including a first opening therein for providing contact to the at least one trench, and including a second opening therein for providing contact to the at least one additional trench.

16. The semiconductor device of claim 15, further comprising:
    a first conductive contact formed in the first opening; and
    a second conductive contact formed in the second opening,
    wherein said first and second conductive contacts provide electrical connection terminals.

17. The semiconductor device of claim 1, wherein a surface of the device is substantially planar.

* * * * *